(12) United States Patent
Gao

(10) Patent No.: US 12,125,749 B2
(45) Date of Patent: Oct. 22, 2024

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Yuanhao Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 470 days.

(21) Appl. No.: 17/479,146

(22) Filed: Sep. 20, 2021

(65) Prior Publication Data

US 2023/0025859 A1    Jan. 26, 2023

Related U.S. Application Data

(63) Continuation of application No. PCT/CN2021/107199, filed on Jul. 19, 2021.

(30) Foreign Application Priority Data

Jul. 13, 2021   (CN) .......................... 202110790535.3

(51) Int. Cl.
*H01L 21/768* (2006.01)
*H01L 23/48* (2006.01)
*H01L 23/532* (2006.01)

(52) U.S. Cl.
CPC .. *H01L 21/76898* (2013.01); *H01L 21/76802* (2013.01); *H01L 21/7684* (2013.01); *H01L 21/76843* (2013.01); *H01L 21/76877* (2013.01); *H01L 23/481* (2013.01); *H01L 23/53238* (2013.01)

(58) Field of Classification Search
CPC ...................................................... H01L 23/481
See application file for complete search history.

(56) References Cited

U.S. PATENT DOCUMENTS

| 7,271,482 | B2 | 9/2007 | Kirby | |
| 8,062,975 | B2* | 11/2011 | Sanders | H01L 23/481 |
| | | | | 257/E21.597 |
| 8,329,579 | B2* | 12/2012 | Sanders | H01L 23/481 |
| | | | | 257/E21.597 |

(Continued)

FOREIGN PATENT DOCUMENTS

| CN | 103210486 A | 7/2013 |
| CN | 103681390 A | 3/2014 |

(Continued)

*Primary Examiner* — David A Zarneke
(74) *Attorney, Agent, or Firm* — Syncoda LLC; Feng Ma

(57) ABSTRACT

Embodiments of this application provide a semiconductor structure and a method for forming the same. The method for forming the semiconductor structure includes: a first substrate is provided; the back surface of the first substrate is etched to form a trench; a conductive layer is formed in the trench; a first conductive column that extends into the trench is formed at a back surface of the first substrate; a device layer is formed at a front surface of the first substrate, and the device layer includes a storage array and a contact structure; and a second conductive column that penetrates through the device layer and extends into the first substrate is formed; the first conductive column is electrically connected with the second conductive column through the conductive layer.

16 Claims, 16 Drawing Sheets

(56) References Cited

U.S. PATENT DOCUMENTS

| | | | | |
|---|---|---|---|---|
| 8,405,115 B2* | 3/2013 | Samoilov | | H01L 23/481 |
| | | | | 257/E31.127 |
| 8,421,238 B2* | 4/2013 | Inagaki | | H01L 25/0657 |
| | | | | 257/E23.145 |
| 8,592,988 B2* | 11/2013 | Lee | | H01L 21/76898 |
| | | | | 257/773 |
| 8,796,135 B2* | 8/2014 | Oganesian | | H01L 24/06 |
| | | | | 438/666 |
| 8,847,380 B2 | 9/2014 | Oganesian | | |
| 8,853,072 B2* | 10/2014 | Wood | | H01L 24/03 |
| | | | | 438/618 |
| 9,018,094 B2* | 4/2015 | Kosenko | | H01L 23/49827 |
| | | | | 438/668 |
| 9,536,837 B2* | 1/2017 | Lamy | | H01L 23/481 |
| 9,589,879 B2* | 3/2017 | Kosenko | | H05K 1/115 |
| 9,887,123 B2* | 2/2018 | Kar-Roy | | H01L 21/74 |
| 2006/0148250 A1 | 7/2006 | Kirby | | |
| 2006/0205211 A1 | 9/2006 | Kirby | | |
| 2009/0008780 A1 | 1/2009 | Kirby | | |
| 2009/0294983 A1* | 12/2009 | Cobbley | | H01L 24/48 |
| | | | | 257/774 |
| 2010/0155940 A1* | 6/2010 | Kawashita | | H01L 25/0657 |
| | | | | 257/737 |
| 2012/0068330 A1 | 3/2012 | Oganesian | | |
| 2013/0119543 A1* | 5/2013 | Yu | | H01L 23/481 |
| | | | | 257/E21.586 |
| 2013/0175673 A1* | 7/2013 | Jin | | H01L 23/481 |
| | | | | 257/621 |
| 2014/0061940 A1* | 3/2014 | Kitao | | H01L 21/76898 |
| | | | | 438/653 |
| 2014/0103520 A1* | 4/2014 | Kirby | | H01L 23/481 |
| | | | | 257/737 |
| 2014/0159249 A1* | 6/2014 | Uzoh | | H01L 23/49827 |
| | | | | 257/774 |
| 2014/0175614 A1* | 6/2014 | Wang | | H01L 24/81 |
| | | | | 257/621 |
| 2014/0264911 A1* | 9/2014 | Lin | | H01L 23/535 |
| | | | | 257/774 |
| 2015/0083469 A1* | 3/2015 | Sunohara | | H01L 21/2885 |
| | | | | 174/255 |
| 2015/0130077 A1 | 5/2015 | Oganesian et al. | | |
| 2016/0284627 A1 | 9/2016 | Oganesian et al. | | |
| 2018/0114743 A1 | 4/2018 | Oganesian et al. | | |
| 2020/0411414 A1* | 12/2020 | Lee | | H01L 23/481 |
| 2021/0134705 A1* | 5/2021 | Ma | | H01L 25/50 |

FOREIGN PATENT DOCUMENTS

| | | |
|---|---|---|
| CN | 111769072 A | 10/2020 |
| CN | 111883498 A | 11/2020 |

* cited by examiner

SEMICONDUCTOR STRUCTURE AND METHOD FOR FORMING SAME

CROSS-REFERENCE TO RELATED APPLICATIONS

The present application is a U.S. continuation application of International Application No. PCT/CN2021/107199, filed on Jul. 19, 2021, which claims priority to Chinese Patent Application No. 202110790535.3, filed on Jul. 13, 2021. International Application No. PCT/CN2021/107199 and Chinese Patent Application No. 202110790535.3 are incorporated herein by reference in their entireties.

TECHNICAL FIELD

The present disclosure relates to, but is not limited to, a semiconductor structure and a method for forming the same.

BACKGROUND

With the development of semiconductor technologies, the characteristic size of an integrated circuit is continuously reduced, and the interconnection density of devices is continuously increased. In order to reach devices with high density, better performance and a lower overall cost, technicians have developed a series of advanced packaging technology. A three-dimensional packaging technology, which has better electrical properties, higher reliability and ability of achieving higher packaging destiny, is widely applied to various high-speed circuits and miniaturized systems. A through-silicon via (TSV) technology is a new technology for stacking chips to form interconnections in a three-dimensional integrated circuit, where many vertically interconnected TSV structures are manufactured on a silicon wafer to achieve electrical interconnections among different chips. The TSV technology allows the maximum density of the chips stacked in a three-dimensional direction, the shortest interconnecting line among the chips, and the smallest overall size. Moreover, the chip speed and the low power consumption performance are greatly improved. The TSV technology is currently the most remarkable technology among electronic packaging technologies.

However, since the TSV structure has a greater depth-to-width ratio, the TSV structure will not work if a problem occurs to any one of an etching process, a filling process and an aligning process.

SUMMARY

According to a first aspect, embodiments of this application provide a method for forming a semiconductor structure. The method includes the following operations.

A first substrate is provided.

A back surface of the first substrate is etched to form a trench.

A conductive layer is formed in the trench.

A first conductive column that extends into the trench is formed at the back surface of the first substrate.

A device layer is formed at a front surface of the first substrate, and the device layer includes a storage array and a contact structure.

A second conductive column that penetrates through the device layer and extends into the first substrate is formed.

The second conductive column is electrically connected with the first conductive column through the conductive layer.

According to a second aspect, embodiments of the application provide a semiconductor structure. The semiconductor structure includes a substrate, a device layer and a TSV. The device layer is located at a front surface of the substrate. The TSV is arranged in the substrate and penetrates through the substrate and the device layer.

BRIEF DESCRIPTION OF THE DRAWINGS

In the drawings, unless otherwise specified, the same reference numerals through drawings indicate the same or similar parts or elements. The drawings are not necessarily drawn to scale. It should be understood that the drawings only describe some implementation modes of this application, and should not be regarded as limiting the scope of this application.

DETAILED DESCRIPTION

Figure 1:
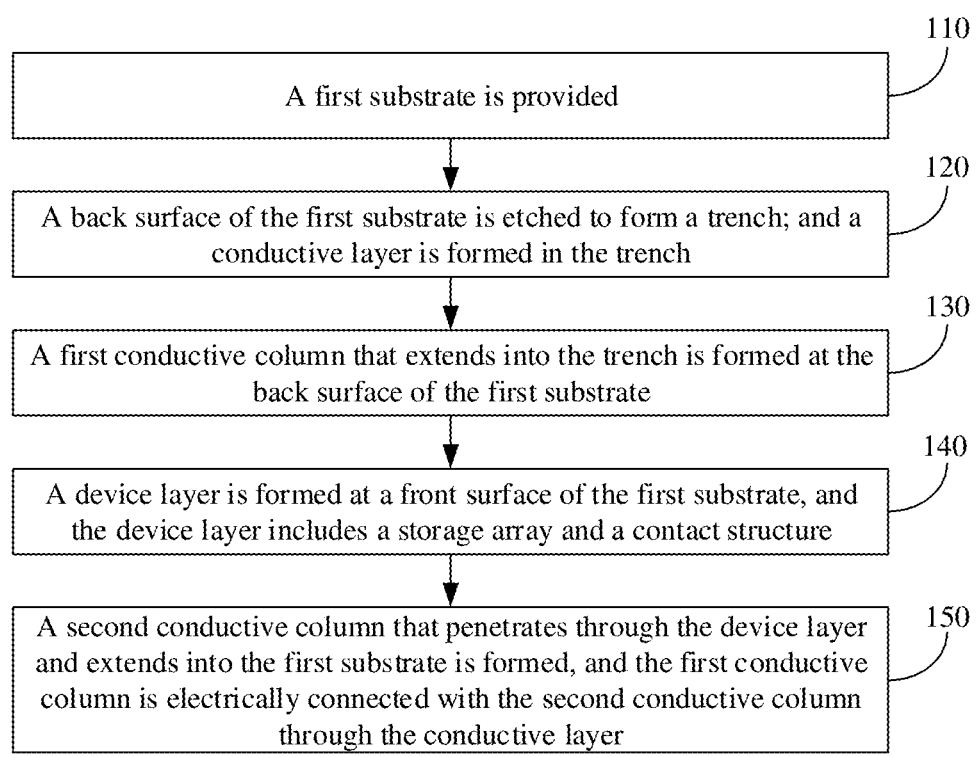
FIG. 1 is a flowchart schematic diagram of a method for forming a TSV structure according to embodiments of this application.

The following clearly and completely describes the exemplary implementation modes of this application with reference to the accompanying drawings. Although the drawings show exemplary implementation modes of this application, it should be understood that this application can be implemented in various forms and shall not be limited by implementation modes described herein. In fact, these implementation modes are provided to understand this application thoroughly, and completely convey the scope of this application to person skilled in the art.

A number of specific details are given below to provide a more thorough understanding of this application. However, it is apparent to person skilled in the art that this application can be implemented without one or more of these details. In other examples, to avoid confusion with this application, some technical features known in the art are not described; namely, not all the features of the actual embodiments are described here. Known functions and structures are not described in detail.

In addition, the drawings are schematic diagrams of this application only and are not necessarily drawn to scale. The same reference numeral in the drawing indicates the same or similar part, so their repeated description will be omitted. Some of the block diagrams shown in the drawings are functional entities, and do not necessarily correspond to physically or logically independent entities. These functional entities may be implemented in software form, or in one or more hardware modules or integrated circuits, or in different network and/or processor devices and/or microcontroller devices.

The flowchart shown in the drawings is an exemplary description only and does not necessarily include all the steps. For example, some steps may also be decomposed, while some steps may be merged or partially merged, so the order of actual execution may be changed according to the actual situation.

It should be understood that spatially relational terms such as "under", "beneath", "lower", "below", "above", and "upper" may be used herein for convenience of description to describe a relationship between one element or feature and another illustrated in the figures. It is to be understood that, in addition to the orientation shown in the figures, the spatially relational terms are intended to further include different orientations of devices in use and operation. For example, if the devices in the figures are turned over, elements or features described as being "beneath" or "below" or "under" other elements or features will be oriented to be "on" the other elements or features. Therefore, the exemplary terms "beneath" and "under" may include both above and below. The device may be additionally oriented (rotated by 90 degrees or in other orientations) and the spatial descriptors used herein may be interpreted accordingly.

The terms used herein are for the purpose of describing specific embodiments only and not intended to limit the disclosure. As used herein, singular forms "a/an", "one", and "the" are also intended to include the plural forms, unless otherwise specified in the context. It is also to be understood that, when the terms "comprising" and/or "including" are used in this specification, the presence of the features, integers, steps, operations, elements, and/or components is determined, but the presence or addition of one or more other features, integers, steps, operations, elements, components, and/or groups is also possible. As used herein, the term "and/or" includes any and all combinations of the related listed items.

Embodiments of this application provide a method for forming a semiconductor structure. FIG. 1 is a flowchart schematic diagram of a method for forming a semiconductor structure according to embodiments of this application. As shown in FIG. 1, the method mainly includes the following operations.

At S110, a first substrate is provided.

At S120, the back surface of the first substrate is etched to form a trench. A conductive layer is formed in the trench.

In embodiments of this application, the first substrate is provided. Herein, the first substrate may be a semiconductor substrate. The semiconductor substrate may be an elemental semiconductor material substrate (for example, a silicon (Si) substrate, a germanium (Ge) substrate, etc.), a composite semiconductor material substrate (for example, a silicon-germanium (SiGe) substrate), or a silicon on insulator (SOI) substrate and a germanium on insulator (GeOI) substrate, etc.

In embodiments of this application, before S120, the back surface of the first substrate may also be subjected to chemical mechanical polishing (CMP) treatment, so as to thin the first substrate. For example, the thickness of the first substrate is ground to 50-70 μm. In an actual application, the thinning thickness of the first substrate may be adjusted according to the actual needs.

In embodiments of this application, a first insulation layer, a first diffusion barrier layer and a copper thin film layer are successively deposited in the trench. The copper thin film layer located at the bottom of the trench forms the conductive layer. A second diffusion barrier layer is deposited in the trench. The second diffusion barrier layer covers the copper thin film layer. An insulation material is filled in the trench to form an insulation filling layer. The insulation filling layer covers the second diffusion barrier layer.

Figure 2A:
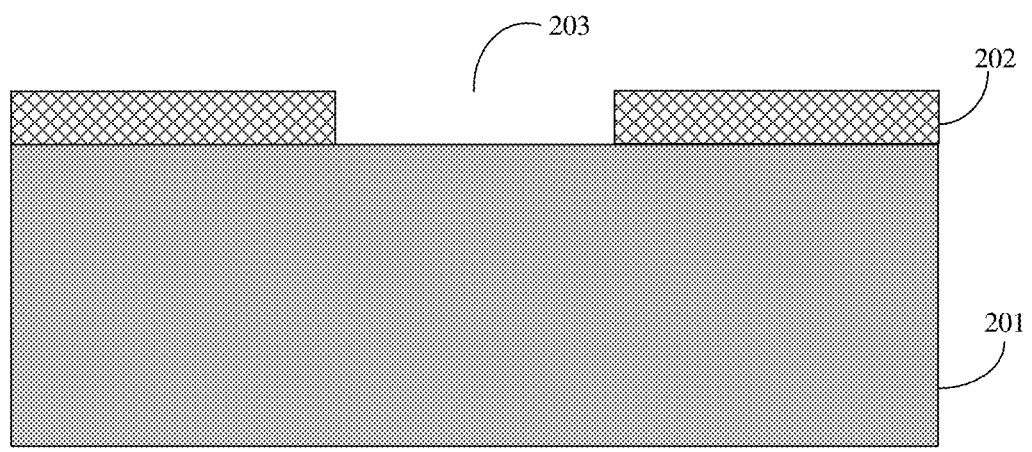
FIG. 2A to FIG. 2N are local sectional schematic diagrams of a forming process of a TSV structure according to one embodiment of this application.
Figure 2B:
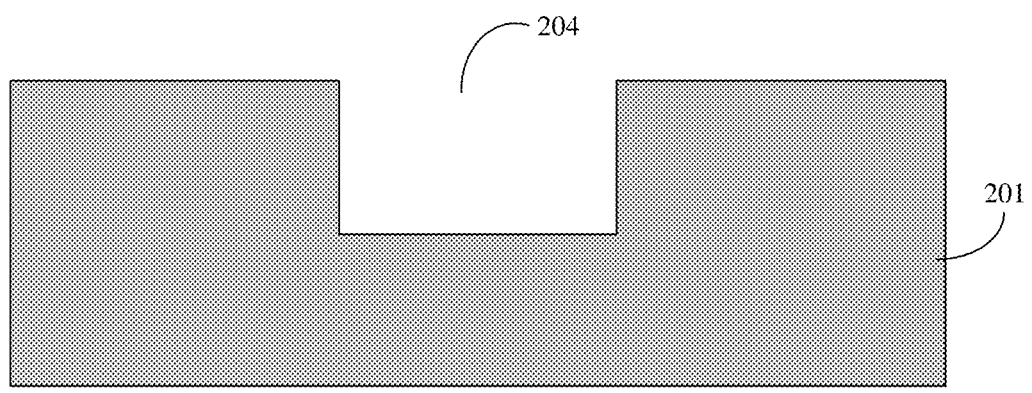
Figure 2C:
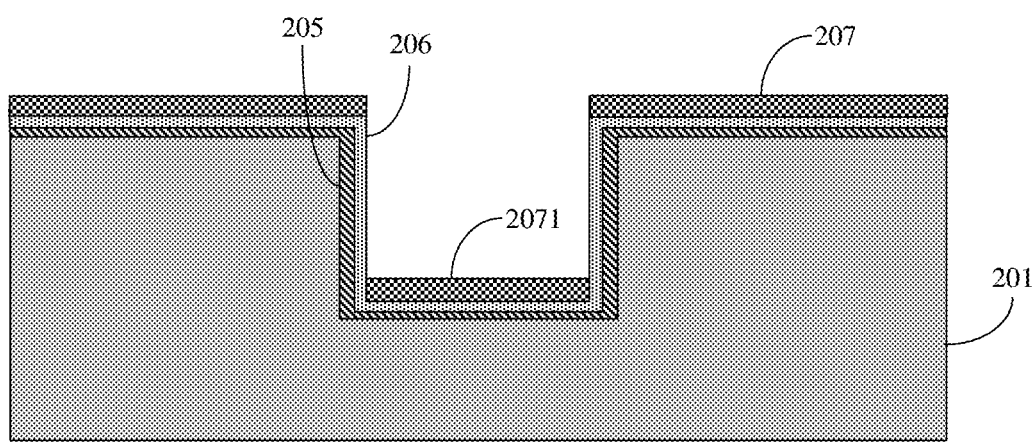
Figure 2D:
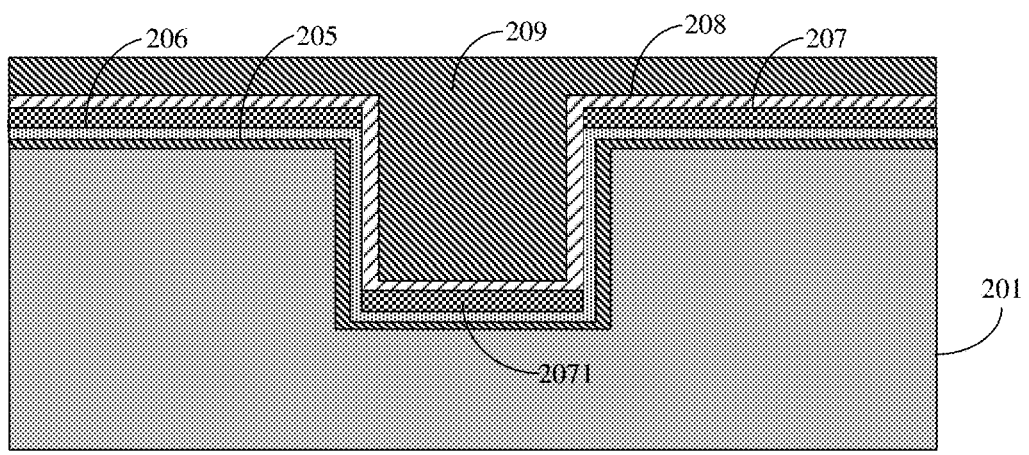
Figure 2E:
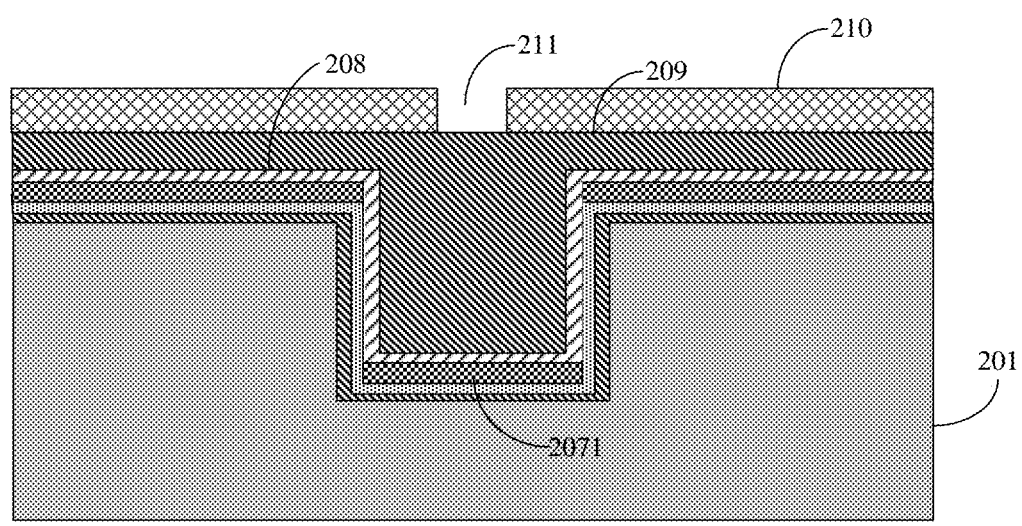
Figure 2F:
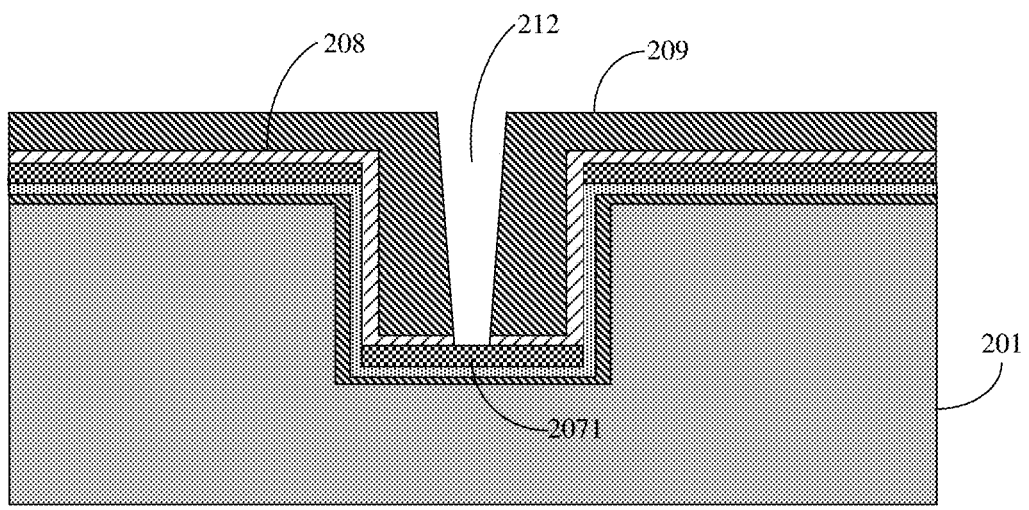
Figure 2G:
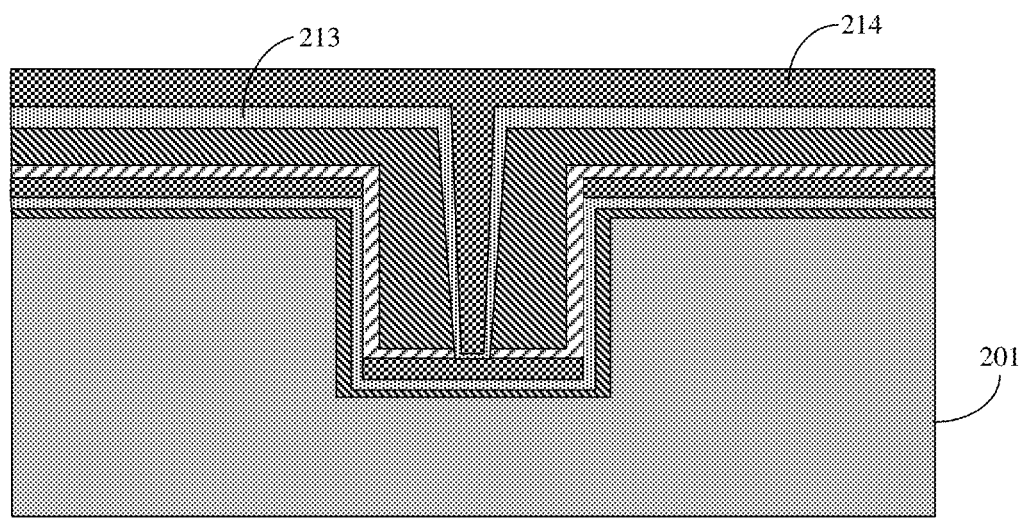
Figure 2H:
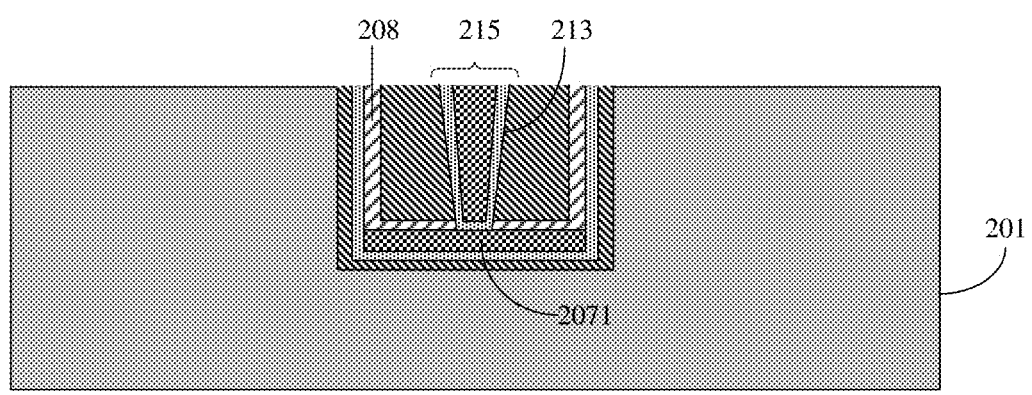
Figure 2I:
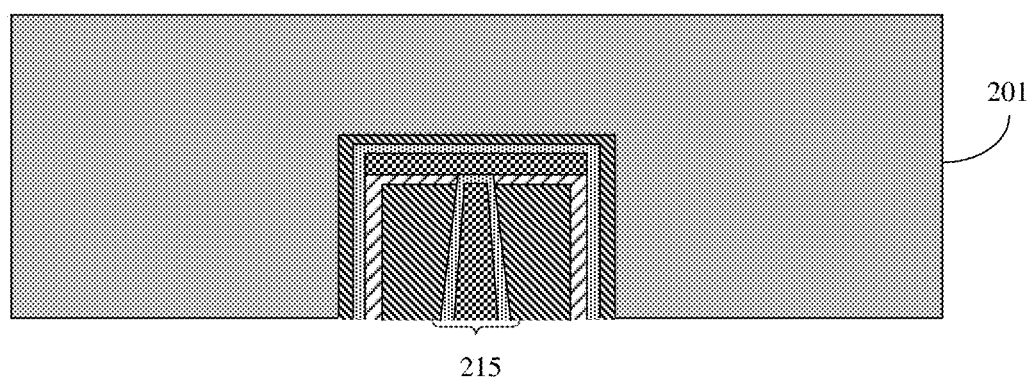
Figure 2J:
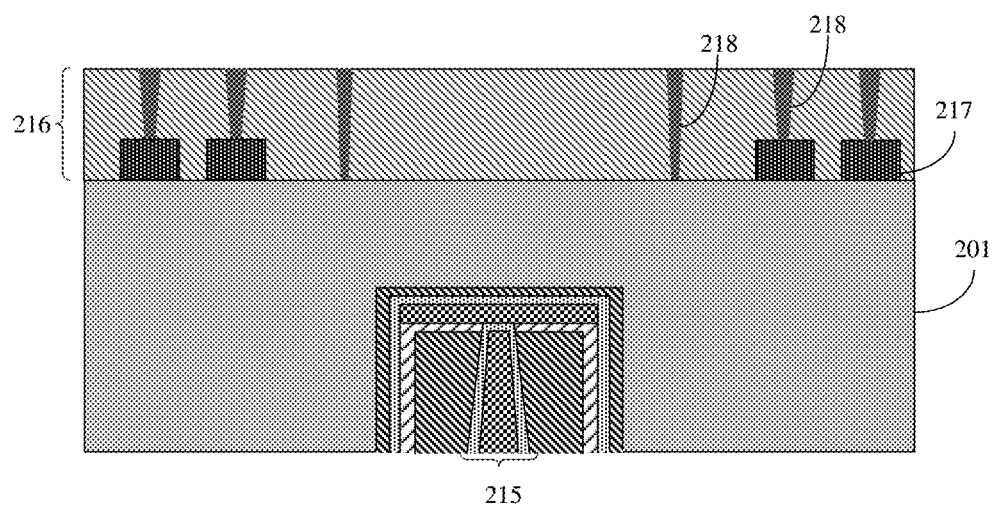
Figure 2K:
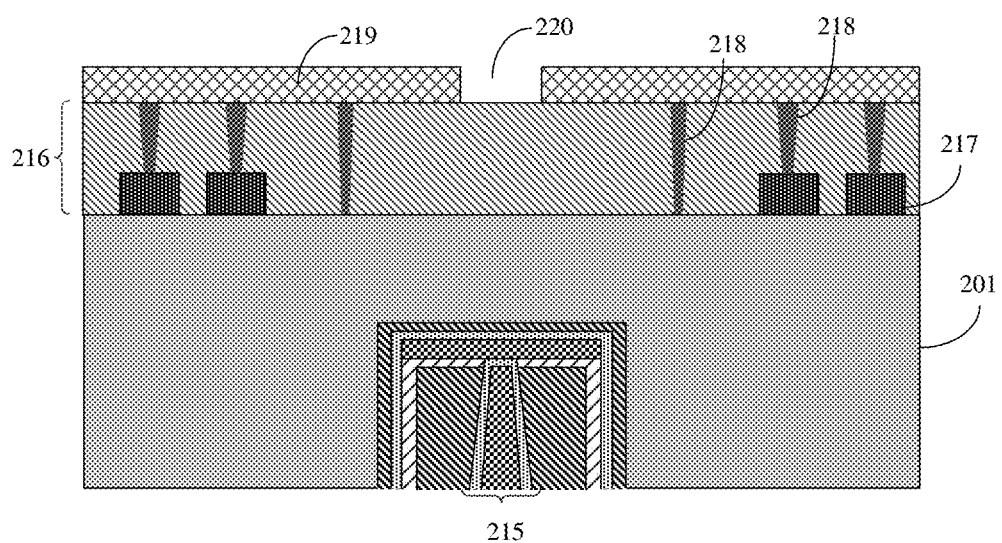
Figure 2L:
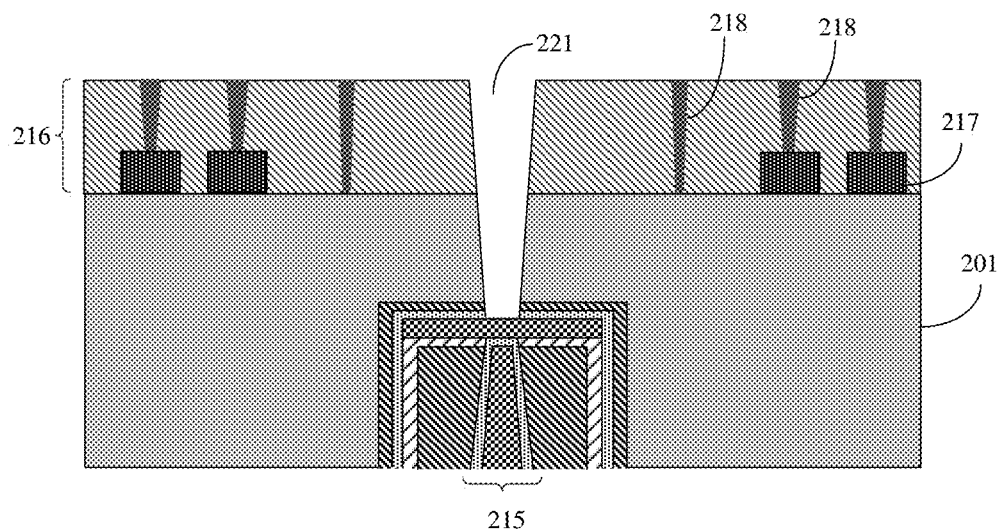
Figure 2M:
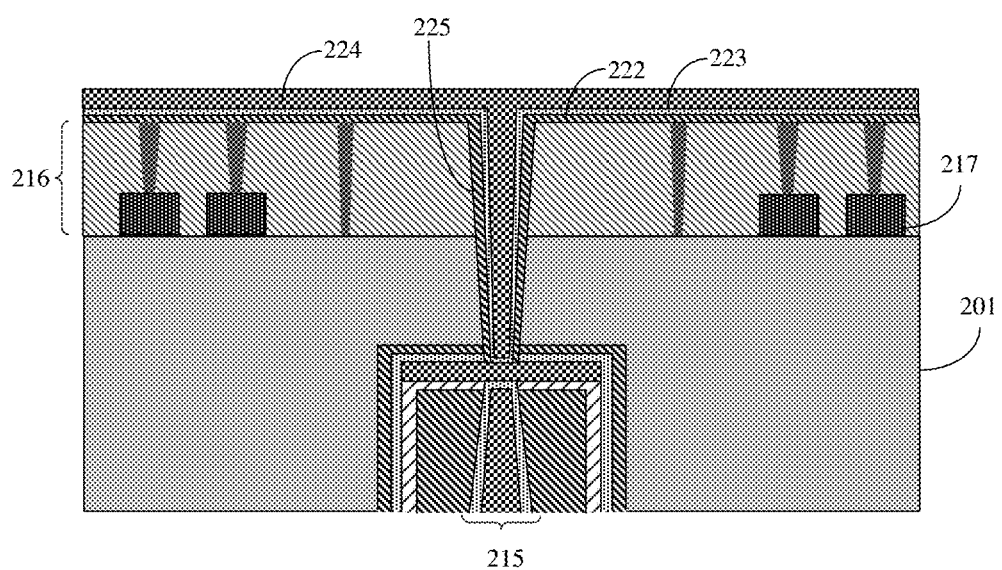
Figure 2N:
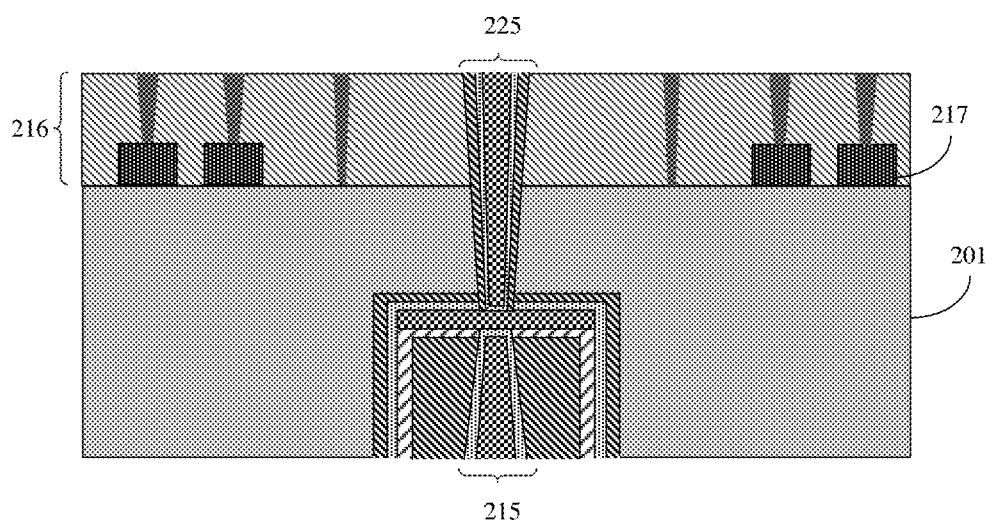

FIG. 2A to FIG. 2N are local sectional schematic diagrams of a forming process for a semiconductor structure according to one embodiment of this application. The method for forming the semiconductor structure of the embodiment of this application is described below in combination with FIG. 1 and FIG. 2A to FIG. 2N.

In the embodiment of this application, as shown in FIG. 2A, a photoetching glue layer 202 is formed at the back surface of the first substrate 201. The photoetching glue layer 202 is exposed and developed to obtain photoetching glue layer 202 that is patterned. The photoetching glue layer 202 that is patterned has a first opening 203. In a specific embodiment, the first opening may be a circular opening, and the diameter of the circular opening is 10-30 μm. It needs to be noted that the first opening may be an opening with other shapes, for example, an elliptical opening, a square opening and the like, the application is not limited thereto.

The first substrate 201 is etched by taking the photoetching glue layer 202 that is patterned as a mask, so as to form the trench 204. After that, the photoetching glue layer 202 is removed, and the formed structure is as shown in FIG. 2B. In some embodiments, after removing the photoetching glue layer 202 that is patterned, the formed structure may be washed, so as to remove the etching residue. In an actual application, the first substrate may be etched for example by a dry etching process. In a specific embodiment, the etching depth of the trench 204 may be 30-50 μm. In an actual application, the etching thickness of the trench can be adjusted according to the actual needs.

In embodiments of this application, the depth of the trench is equal to half of the thickness of the first substrate.

The first insulation layer 205, the first diffusion barrier layer 206 and the copper thin film layer 207 are successively deposited in the trench. The copper thin film layer located at the bottom of the trench forms the conductive layer 2071. In a specific embodiment, the thickness of the conductive layer 2071 may be 700-1000 nm. In an actual application, the thickness of the conductive layer may be adjusted according to the actual needs.

In one embodiment, the first insulation layer 205 may be formed in the trench by an atomic layer deposition (ALD) process. The material of the first insulation layer 205 includes, but is not limited to at least one of $SiO_2$, $Si_3N_4$ or low dielectric constant material. The first diffusion barrier layer 206 is formed on the first insulation layer 205 by a physical vapor deposition (PVD) process. The material of the first diffusion barrier layer 206 includes, but is not limited to at least one of TaN, Ta, ZrN or Cu. The copper thin film layer 207 is formed on the first diffusion barrier layer 206 by an electroplating process.

In some embodiments, when forming the copper thin film layer 207, an accelerator and an inhibitor may be added in the electroplating process to control the deposition rate, so that the copper thin film layer 207 is formed at the bottom and top of the trench, while less copper thin film layer is deposited at the side wall of the trench. In a specific example, the accelerator may be polyalkylene glycol, and the inhibitor may be organic sulfide. In some embodiments, the copper thin film layer deposited at the side wall of the trench may also be removed through dry etching, and only the copper thin film layer at the bottom of the top of the trench is reserved.

After performing the above deposition, the formed structure is as shown in FIG. 2C.

A second diffusion barrier layer 208 is deposited in the trench. An insulation material is filled in the trench to form an insulation filling layer 209, and the formed structure is as shown in FIG. 2D. In some embodiments, the second diffusion barrier layer is deposited by the ALD process. The material of the second diffusion barrier layer includes, but is not limited to at least one of SiN, TaN or Tia. The insulation filling layer is formed in the trench by a Chemical Vapor Deposition (CVD) process. The material of the insulation filling layer includes, but is not limited to at least one of $SiO_2$, $Si_3N_4$ or low dielectric constant material.

Herein, a trench structure includes the first insulation layer 205, the first diffusion barrier layer 206, the copper thin film layer 207, the second diffusion barrier layer 208 and the insulation filling layer 209. The copper thin film layer at the bottom of the trench forms the conductive layer 2071.

The material of the first insulation layer 205 may be the same as that of the insulation filling layer 209.

At S130, a first conductive column that extends into the trench is formed at the back surface of the first substrate.

As shown in FIG. 2E, a first photomask layer 210 that is patterned is formed, and the first photomask layer 210 that is patterned is provided with a second opening 211. In a specific embodiment, the second opening may be a circular opening, and the diameter of the circular opening is 7-10 μm. It needs to be noted that the second opening may be an opening with other shapes, for example, an elliptical opening, a square opening and the like, the application is not limited thereto.

The insulation filling layer 209 and the second diffusion barrier layer 208 is etched by taking the first photomask layer 210 that is patterned including the second opening a mask, to form a first blind hole 212. After forming the first blind hole 212, the first photomask layer 210 that is patterned is removed, and the formed structure is as shown in FIG. 2F. Herein, the first blind hole 212 exposes part of the conductive layer 2071. When forming the first blind hole 212 by etching, the conductive layer 2071 may be used as an etching stopping layer. The etching of the first blind hole stops at the copper thin film layer 207 by controlling the etching selection ratio, so that the first blind hole penetrates through the insulation filling layer 209 and the second diffusion barrier layer 208 to expose part of the conductive layer 2071.

As shown in FIG. 2G, a third diffusion barrier layer 213 is deposited in the first blind hole 212, and the third diffusion barrier layer 213 covers the side of the first blind hole 212 and exposes part of the conductive layer 2071. A first metal material 214 is filled in the first blind hole, and the first metal material 214 covers the third diffusion barrier layer 213. In some embodiments, the third diffusion barrier layer 213 is deposited in the first blind hole by the PVD process, and the material of the third diffusion barrier layer includes, but is not limited to at least one of TaN, Ta, ZrN or Cu. The first metal material 214 is filled in the first blind hole by the electroplating process, and the first metal material includes, but is not limited to at least one of copper or tungsten.

The material of the third diffusion barrier layer 213 may be the same as that of the first diffusion barrier layer 206. The material of the first metal material 214 may be the same as that of the copper thin film layer 207.

As shown in FIG. 2G, the chemical mechanical polishing process is performed at the back surface of the first substrate, so that the top surface of the first conductive column is flush with that of the substrate, and the formed structure is as shown in FIG. 2H. The first substrate may also be thinned from the back surface of the first substrate through the above chemical mechanical polishing process, and the thickness of the first substrate may be ground to 40-60 μm. In an actual application, the thinning thickness of the first substrate may be adjusted according to the actual needs.

In combination with FIG. 2A to FIG. 2H, namely, the first conductive column 215 extending into the first substrate 201 is formed at the back surface of the first substrate 201. The first conductive column 215 is formed in the trench structure and electrically connected with the conductive layer 2071 at the bottom of the trench.

As shown in FIG. 2H, the third diffusion barrier layer 213 in the first conductive column 215 contacts with the conductive layer 2071 through the opening of the second diffusion barrier layer 208 at the bottom of the trench, so that the first metal material 214 filled in the first conductive column 215 is electrically connected with the conductive layer 2071 through the third diffusion barrier layer 213.

At S140, the device layer is formed on the front surface of the first substrate, and the device layer includes a storage array and a contact structure.

As shown in FIG. 2I, the structure as shown in FIG. 2H is overturned, so that the front surface of the first substrate 201 is upwards.

As shown in FIG. 2J, the device layer 216 is formed on the front surface of the first substrate 201, and the device layer 216 includes the storage array 217 and the contact structure 218. The storage array 217 may include structures such as an active area, a word line, a bit line and a capacitance. The contact structure 218 may include a conductive contact structure and a metal layer that are formed on the storage array 217, and is configured to lead out the storage array. For example, the contact structure 218 may be configured to control the signal transmission of one or more source electrodes and/or drain electrodes, the word line, and the bit line in the active area. In this embodiment, the contact structure 218 is formed in the insulation layer.

In a specific example, the contact structure 218 may include a peripheral contact structure formed on the storage array 217, a metal layer electrically connected to the peripheral contact structure and a conductive contact structure electrically connected to the metal layer. Herein, the metal layer is located between the peripheral contact structure and the conductive contact structure.

At S150, the second conductive column that penetrates through the device layer and extends into the first substrate is formed, and the second conductive column is electrically connected with the first conductive column through the conductive layer.

In the embodiment of this application, as shown in FIG. 2K, a second photomask layer 219 that is patterned is formed, and the second photomask layer 219 that is patterned is provided with a third opening 220. In a specific embodiment, the third opening may be a circular opening, and the diameter of the circular opening is 7 μm. It needs to be noted that the third opening may be an opening with other shapes, for example, an elliptical opening, a square opening and the like, the application is not limited thereto.

As shown in FIG. 2L, the device layer 216 and the first substrate 201 is etched by taking the second photomask layer 219 that is patterned including the third opening as a mask, to form a second blind hole 221. After forming the second blind hole 221, the second photomask layer 219 that is patterned is removed, and the second blind hole 221 exposes part of the conductive layer 2071. The conductive layer 2071 is used as an etching stopping layer, and the second blind hole 221 is formed by etching. By controlling the etching selection ratio, the second blind hole penetrates through the device layer 216, the first insulation layer 205 and the first diffusion barrier layer 206, and exposes part of the conductive layer 2071.

In some embodiments, the opening size of the first blind hole is the same as or different from that of the second blind hole as long as that the opening size of the first blind hole and the opening size of the second blind hole are less than the width (along a horizontal direction of the first substrate) of the conductive layer 2071.

As shown in FIG. 2M, the second insulation layer 222 is deposited in the second blind hole 221, and the second insulation layer 222 at the bottom of the second blind hole is removed by etching. A fourth diffusion barrier layer 223 is deposited in the second blind hole and the second metal material 224 is filled in the second blind hole, so as to form the second conductive column 225. Herein, the second insulation layer is deposited in the trench by the ALD process, and the material of the second insulation layer includes, but is not limited to at least one of $SiO_2$, $Si_3N_4$ or low dielectric constant material. The fourth diffusion barrier layer is deposited on the second insulation by the PVD process, and the material of the fourth diffusion barrier layer includes, but is not limited to at least one of TaN, Ta, ZrN or Cu. The second metal material is filled in the first blind hole through the electroplating process, and the material of the second metal material includes, but is not limited to at least one of copper or tungsten.

The material of the second insulation layer 222 may be the same as that of the first insulation layer 205. The material of the fourth diffusion barrier layer 223 may be the same as that of the third diffusion barrier layer 213. The material of the second metal material 224 is the same as that of the first metal material 214.

In the embodiments of this application, the fourth diffusion barrier layer 223 in the second conductive column 225 contacts with the conductive layer 2071 through at the opening the second insulation layer 222 at the bottom of the second blind hole, so that the second metal material 224 filled in the second conductive column 225 is electrically connected to the conductive layer 2071 through the fourth diffusion barrier layer 223.

In the embodiments of this application, the second conductive column 225 is electrically connected with the first conductive column 215 through the conductive layer 2071 at the bottom of the trench.

The chemical mechanical polishing process is performed on the structure as shown in FIG. 2M, so that the second conductive column is flattened from the front surface of the first substrate 201, and the top surface of the second conductive column 225 is flush with that of the device layer 216. The formed TSV structure is as shown in FIG. 2N.

As shown in FIG. 2N, the TSV structure includes the first conductive column 215, the second conductive column 225 and the conductive layer 2071 that are electrically connected to each other. The TSV structure is cross-shaped. The widths of the first conductive column 215 and the second conductive column 225 are gradually reduced in a direction perpendicular to and towards the conductive layer 2071.

Thus, in the embodiments of this application, the first conductive column 215 is formed in the trench structure, and the first conductive column 215 is electrically connected with the second conductive column 225 through the conductive layer 2071. In a direction parallel to the substrate, the width of the conductive layer 2071 is greater than that of the contact surface of the first conductive column 215 and the conductive layer 2071 and that of the contact surface of the second conductive column 225 and the conductive layer 2071, so that when the second conductive column 225 is formed at the front surface of the first substrate, it only needs to contact with the conductive layer 2071. In other words, the projections of the first conductive column 215 and the second conductive column 225 on the conductive layer 2071 are not necessarily completely overlapped. By doing so, the process window of the second conductive column is increased, the alignment difficulty of the first conductive column and the second conductive column is reduced, the contact area of the first conductive column and the second conductive column is increased, and then the resistance of the TSV is reduced, and the conductive performance of the TSV is improved.

In some embodiments, after S140, the method further includes: an interconnection layer is formed on the device layer, and the interconnection layer is electrically connected to the second conductive column. The interconnection layer includes an interconnection through hole and an interconnection metal layer. In an actual application, multiple stacked interconnection layers may be formed on the device layer. According to the stacking order of the interconnection layers, the interconnection layer closest to the device layer may be taken as the first interconnection layer, and the interconnection layer on the first interconnection layer is taken as the second interconnection layer, and so on.

In another embodiment, after S140, the method further includes: a bonding structure is provided, and the bonding structure includes a second substrate and an interconnection layer formed on the second substrate. The interconnection layer includes an interconnection through hole and an interconnection metal layer, and the interconnection layer is bonded with the device layer. Herein, the interconnection layer is electrically connected to the second conductive column. In an actual application, multiple stacked interconnection layers may be formed on the second substrate. When bonding, the interconnection layer at the uppermost layer is bonded with the device layer. According to the stacking order of the interconnection layers, the interconnection layer closest to the device layer may be taken as the first interconnection layer and the interconnection layer on the first interconnection layer is taken as the second interconnection layer, and so on.

In the embodiments of this application, the interconnection through hole in the interconnection layer is electrically connected to the second conductive column.

In the embodiments of this application, the device layer and the interconnection layer are formed on different substrates, by doing so, the manufacturing processes for the device layer and the interconnection layer can be synchronously performed, so that the manufacturing time of the storage chip can be effectively shortened.

Figure 3:
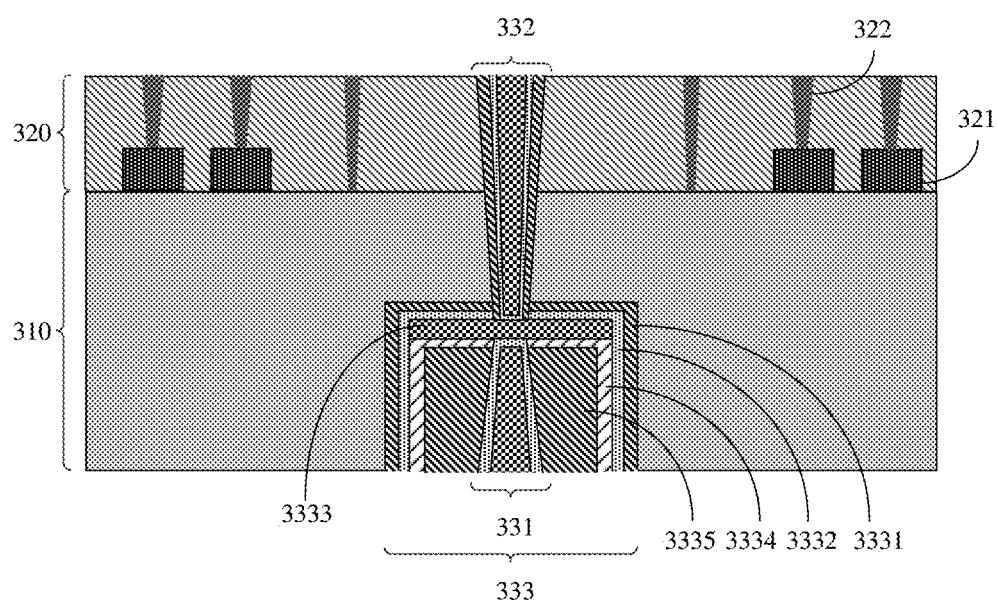
FIG. 3 is a sectional schematic diagram of a semiconductor structure according to embodiments of this application.

Further, the embodiments of this application provide a semiconductor structure, which includes a substrate; a device layer, which is located at the front surface of the substrate; and a TSV, which is arranged in the substrate and penetrates through the substrate and the device layer. FIG. 3 shows the semiconductor structure provided by the embodiments of the application. As shown in FIG. 3, the semiconductor structure includes a substrate 310; a device layer 320, which is located at the front surface of the substrate 310; and a TSV.

The TSV is arranged in the substrate and penetrates through the substrate 310 and the device layer 320.

In the embodiments of this application, the device layer 320 includes the storage array 321 and the contact structure 322.

In the embodiments of this application, the TSV includes the first conductive column 331, which extends into the substrate from the back surface of the substrate; the second conductive column 332, which penetrates through the device layer 320 and extends into the substrate from the front surface of the substrate; and the conductive layer 3333, the first conductive column 331 and the second conductive column 332 are electrically connected through the conductive layer 3333.

In the embodiments of this application, the TSV further includes a trench structure 333, which extends into the substrate from the back surface of the substrate, and does not penetrate through the substrate 310.

In the embodiments of this application, the trench structure includes the first insulation layer 3331, the first diffusion barrier layer 3332, the copper thin film layer, the second diffusion barrier layer 3334 and the insulation filling layer 3335. The copper thin film layer at the bottom of the trench structure 333 forms the conductive layer 3333.

It needs to be noted that the copper thin film layer may be formed at the bottom of the trench only rather than the side wall of the trench when forming the copper thin film layer. At this time, the copper thin film layer in the trench is the conductive layer.

In the embodiments of this application, the first conductive column 331 penetrates through the insulation filling layer 3335 and the second diffusion barrier layer 3334, and is electrically connected to the conductive layer 3333.

In the embodiments of this application, the second conductive column 332 penetrates through the first insulation layer 3331 and the first diffusion barrier layer 3332, and is electrically connected to the conductive layer 3333.

In the embodiments of this application, the first conductive column is formed in the trench structure, and the first conductive column is electrically connected with the second conductive column through the conductive layer in the trench structure. In a direction parallel to the substrate, the width of the conductive layer is greater than that of the contact surface of the first conductive column and the conductive layer and that of the contact surface of the second conductive column and the conductive layer, so that when the second conductive column is formed at the front surface of the first substrate, it only needs to be flush with the conductive layer. In other words, the projections of the first conductive column and the second conductive column on the conductive layer are not necessarily completely overlapped. By doing so, the process window of the second conductive column is increased, the alignment difficulty of the first conductive column and the second conductive column is reduced, the contact area of the first conductive column and the second conductive column is increased, and then the resistance of the TSV is reduced, and the conductive performance of the TSV is improved.

The above is only the specific implementation mode of this application, but the scope of protection of this application is not limited to. Person skilled in the art can easily think of changes or replacements within the scope of the technology disclosed in this application, which shall be covered by the scope of protection of this application. Therefore, the scope of protection of this application should be subject to the scope of protection of the appended claims.

It should be understood that term "one embodiment" or "an embodiment" mentioned in the whole specification intend to be included in at least one embodiment this application in combination with the specific characteristics, structures, or characteristics of this embodiment. Therefore, term "in one embodiment" or "in an embodiment" in the whole specification does not necessarily refer to the same embodiment. In addition, these features, structures, or characteristics may be combined in one or more embodiments in any appropriate manner. It should be understood that in the various embodiments of this application, the serial number of the processes mentioned above does not imply the order of execution, the order of execution of various processes shall be determined by its function and internal logic and shall not constitute any limitation on the implementation of the embodiments of this application. The serial number of the embodiments of this application is only for the purpose of description and does not represent the merits of the embodiments.

The methods disclosed in the several method embodiments provided by this application may be arbitrarily combined without conflict to obtain new method embodiments.

The features disclosed in the several method embodiments provided by this application may be arbitrarily combined without conflict to obtain new product embodiments.

The several methods provided by the application or features disclosed in the device embodiments may be arbitrarily combined without conflict to obtain new method embodiments or device embodiments.

The above is only the implementation mode of this application, but the scope of protection of this application is not limited to this. Those skilled in the art can easily think of changes or replacements within the scope of the technology disclosed in this application, which shall be covered by the scope of protection of this application. Therefore, the scope of protection of this application should be subject to the scope of protection of the appended claims.

The invention claimed is:

1. A method for forming a semiconductor structure, comprising:
   providing a first substrate;
   etching a back surface of the first substrate to form a trench, the trench comprises a first insulation layer, a first diffusion barrier layer, a copper thin film layer, a second diffusion barrier layer and an insulation filling layer;
   forming a conductive layer in the trench;
   forming a first conductive column that extends into the trench at the back surface of the first substrate;
   forming a device layer at a front surface of the first substrate, the device layer comprising a storage array and a contact structure; and
   forming a second conductive column that penetrates through the device layer and extends into the first substrate,
   the first conductive column being electrically connected with the second conductive column through the conductive layer;
   wherein the copper thin film layer is arranged at a bottom of the trench to form the conductive layer.

2. The method of claim 1, wherein forming the conductive layer in the trench comprises:
   successively depositing the first insulation layer, the first diffusion barrier layer and the copper thin film layer in the trench,
   the copper thin film layer arranged at a bottom of the trench forming the conductive layer.

3. The method of claim 2, wherein forming the first conductive column that extends into the trench at the back surface of the first substrate comprises:
   depositing the second diffusion barrier layer in the trench, the second diffusion barrier layer covering the copper thin film layer;
   filling an insulation material in the trench to form the insulation filling layer, the insulation filling layer covering the second diffusion barrier layer;
   forming a first blind hole by etching the insulation filling layer and the second diffusion barrier layer, the first blind hole exposing a first part of the conductive layer;

depositing a third diffusion barrier layer in the first blind hole, the third diffusion barrier layer covering a side wall of the first blind hole and the first part of the conductive layer; and filling a first metal material in the first blind hole, the first metal material covering the third diffusion barrier layer.

4. The method of claim 3, wherein before forming the first blind hole, the method further comprises:

forming a first photomask layer on a surface of the insulation filling layer, etching the insulation filling layer and the second diffusion barrier layer by taking the first photomask layer that is patterned as a mask to form the first blind hole.

5. The method of claim 3, wherein an opening size of the trench is greater than an opening size of the first blind hole.

6. The method of claim 3, wherein after filling the first metal material in the first blind hole, the method further comprises:

performing a chemical mechanical polishing process at the back surface of the first substrate, so that a top surface of the first conductive column is flush with a top surface of the first substrate.

7. The method of claim 3, wherein forming the second conductive column that penetrates through the device layer and extends into the first substrate comprises:

forming a second blind hole that penetrates through the device layer and extends into the first substrate by etching, the second blind hole exposing part of the conductive layer;

depositing a second insulation layer in the second blind hole, and removing the second insulation layer at bottom of the second blind hole by etching; and depositing a fourth diffusion barrier layer and filling a second metal material in the second blind hole.

8. The method of claim 7, wherein before forming the second blind hole, the method further comprises:

forming a second photomask layer on a surface of the device layer, etching the device layer and the first substrate by taking the second photomask layer that is patterned as a mask to form the second blind hole.

9. The method of claim 7, further comprising:

performing a chemical mechanical polishing process at the front surface of the first substrate, so that a top surface of the device layer is flush with a top surface of the second conductive column.

10. The method of claim 7, further comprising:

forming an interconnection layer on the device layer, the interconnection layer being electrically connected with the second conductive column, wherein the interconnection layer comprises an interconnection through hole and an interconnection metal layer.

11. The method of claim 7, further comprising:

providing a bonding structure, the bonding structure comprising a second substrate and an interconnection layer formed on the second substrate, wherein the interconnection layer comprises an interconnection through hole and an interconnection metal layer; and bonding the interconnection layer and the device layer.

12. The method of claim 11, wherein the interconnection layer is electrically connected with the second conductive column.

13. A semiconductor structure, comprising:

a substrate;

a device layer that is disposed at a front surface of the substrate; and a through-silicon via (TSV) that is arranged in the substrate and penetrates through the substrate and the device layer;

wherein the TSV comprises:

a first conductive column that extends into the substrate from a back surface of the substrate;

a second conductive column that penetrates through the device layer and extends into the substrate from the front surface of the substrate;

a conductive layer, wherein the first conductive column and the second conductive column are electrically connected through the conductive layer; and a trench structure that extends into the substrate from the back surface of the substrate and does not penetrate through the substrate;

wherein the trench structure comprises a first insulation layer, a first diffusion barrier layer, a copper thin film layer, a second diffusion barrier layer and an insulation filling layer; and wherein the copper thin film layer arranged at a bottom of the trench structure forms the conductive layer;

wherein the first conductive column extends into the trench structure at the back surface of the first substrate.

14. The semiconductor structure of claim 13, wherein the device layer comprises a storage array and a contact structure.

15. The semiconductor structure of claim 13, wherein the first conductive column penetrates through the insulation filling layer and the second diffusion barrier layer, and is electrically connected with the conductive layer.

16. The semiconductor structure of claim 13, wherein the second conductive column penetrates through the first insulation layer and the first diffusion barrier layer, and is electrically connected with the conductive layer.

* * * * *